United States Patent
Wang et al.

(10) Patent No.: US 10,127,337 B1
(45) Date of Patent: Nov. 13, 2018

(54) MODELING DISTRIBUTED SYSTEMS

(71) Applicant: Google Inc., Mountain View, CA (US)

(72) Inventors: Ruiyi Wang, Bellevue, WA (US);
Brian Paul Retford, Seattle, WA (US);
Emily Jane Johnston, San Francisco, CA (US); Joshua Lovejoy, Seattle, WA (US)

(73) Assignee: Google LLC, Mountain View, CA (US)

( * ) Notice: Subject to any disclaimer, the term of this patent is extended or adjusted under 35 U.S.C. 154(b) by 181 days.

(21) Appl. No.: 15/350,016

(22) Filed: Nov. 12, 2016

Related U.S. Application Data

(63) Continuation of application No. 14/313,073, filed on Jun. 24, 2014, now Pat. No. 9,525,599.

(51) Int. Cl.
*G06F 17/50* (2006.01)
*H04L 12/24* (2006.01)
*H04L 29/08* (2006.01)

(52) U.S. Cl.
CPC ...... *G06F 17/5009* (2013.01); *H04L 41/0604* (2013.01); *H04L 67/10* (2013.01)

(58) Field of Classification Search
CPC .. G06F 17/5009; H04L 41/0604; H04L 67/10
See application file for complete search history.

(56) References Cited

U.S. PATENT DOCUMENTS

| | | |
|---|---|---|
| 6,393,386 B1 * | 5/2002 | Zager ............... H04L 41/0233 370/254 |
| 6,529,948 B1 | 3/2003 | Bowman-Amuah |
| 6,560,569 B1 | 5/2003 | Abu El Ata |
| 6,694,362 B1 | 2/2004 | Secor et al. |
| 6,707,795 B1 | 3/2004 | Noorhosseini et al. |
| 6,823,299 B1 | 11/2004 | Contreras et al. |
| 7,024,475 B1 | 4/2006 | Abaye et al. |
| 7,237,138 B2 | 6/2007 | Greenwald et al. |
| 7,783,468 B2 | 8/2010 | Abu El Ata et al. |
| 7,797,147 B2 | 9/2010 | Vinberg et al. |
| 7,802,144 B2 | 9/2010 | Vinberg et al. |
| 8,601,083 B1 | 12/2013 | Roche et al. |
| 8,677,376 B2 | 3/2014 | Kwan et al. |
| 8,701,190 B1 | 4/2014 | Chau et al. |
| 9,208,051 B2 | 12/2015 | Poston et al. |

(Continued)

*Primary Examiner* — Joe Chacko
(74) *Attorney, Agent, or Firm* — Honigman Miller Schwartz and Cohn LLP

(57) ABSTRACT

A modeling system including a data processing device in communication with a non-transitory memory storing a model modeling interactions of resources of a distributed system. The data processing device executes instructions that cause the data processing device to implement a system monitor that monitors interactions of the resources of the distributed system and builds the model. The system monitor detects a state change of a first resource of the distributed system and identifies an entity causing the state change of the first resource. The system monitor determines whether a second resource of the distributed system changes state within a threshold period of time after the first resource changed state. The system monitor updates the model to indicate a relationship between the first resource, the second resource and the identified entity, in response to the first resource and the second resource changing state within the threshold time period.

26 Claims, 9 Drawing Sheets

(56) References Cited

U.S. PATENT DOCUMENTS

| | | |
|---|---|---|
| 2006/0232927 A1* | 10/2006 | Vinberg .............. G06F 11/3447 |
| | | 361/679.02 |
| 2007/0067296 A1 | 3/2007 | Malloy et al. |
| 2007/0239420 A1 | 10/2007 | Papaefstathiou et al. |
| 2008/0027688 A1 | 1/2008 | Jiang et al. |
| 2008/0244600 A1 | 10/2008 | Wong et al. |
| 2011/0314075 A1 | 12/2011 | Boldyrev et al. |
| 2014/0013315 A1 | 1/2014 | Genevski et al. |
| 2014/0047117 A1 | 2/2014 | Jensen-Horne et al. |
| 2015/0263902 A1 | 9/2015 | He et al. |

* cited by examiner

MODELING DISTRIBUTED SYSTEMS

CROSS REFERENCE TO RELATED APPLICATIONS

This U.S. patent application is a continuation of, and claims priority under 35 U.S.C. § 120 from, U.S. patent application Ser. No. 14/313,073, filed on Jun. 24, 2014, which hereby incorporated by reference in its entirety.

TECHNICAL FIELD

This disclosure relates to modeling distributed systems.

BACKGROUND

A distributed system may include many interconnected hardware and software resources. Due to the vast number of resources in a distributed system, some distributed systems are very complex and difficult to understand. In large distributed systems, some resources may affect the operation of other resources. As the size of a distributed system increases, it becomes increasingly difficult to ascertain the effect of a particular resource on other resources in the distributed system. There is a need for a modeling system that models a distributed system and promotes or facilitates understanding the interactions between resources in the distributed system.

SUMMARY

One aspect of the disclosure provides a modeling system. The modeling system includes a non-transitory memory and a data processing device in communication with the non-transitory memory. The memory stores a model modeling interactions of resources of a distributed system. The data processing device executes instructions that cause the data processing device to implement a system monitor. The system monitor monitors interactions of the resources of the distributed system and builds the model. The system monitor detects a state change of a first resource of the distributed system and identifies an entity causing the state change of the first resource. Moreover, the system monitor determines whether a second resource of the distributed system changes state within a threshold period of time after the first resource changed state. Finally, the system monitor updates the model to indicate a relationship between the first resource, the second resource and the identified entity, in response to the first resource and the second resource changing state within the threshold time period. At least one of the first resource and the second resource includes a hardware resource of the distributed system in communication with the data processing device.

In some implementations, the entity causing the state change in the first resource includes a software resource associated with the first and second resources. In other implementations, the entity causing the state change in the first resource includes a hardware resource. In yet other implementations, the entity causing the state change in the first resource includes an event affecting a measurable characteristic of the first resource. In some examples, the event includes a power surge affecting an amount of power delivered to the first resource. In other examples, the event includes an increased processing demand affecting the number of processing jobs the first resource executes.

In some implementations, the system monitor receives data from the first resource or the second resource indicating the relationship between the first resource and the second resource. The system monitor updates the model to indicate the relationship between the first resource and the second resource. In some examples, the first resource or the second resource may push the data to the system monitor. In other examples, the system monitor may fetch the data from the first resource or the second resource.

In some implementations, the system monitor receives data indicating the entity causing the state change of the first resource. The system monitor may receive the data from one or more databases. The system monitor may fetch the data from the databases or a database manager may push the data to the system monitor.

In some implementations, the system monitor receives a request from a requestor in communication with the data processing device to determine an impact of a first software service on a second software service. The system monitor determines a first set of resources of the distributed system associated with the first software service. Moreover, the system monitor determines a second set of resources of the distributed system associated with the second software service. Additionally, the system monitor retrieves relationships between the first set of resources and the second set of resources from the model. Finally, the system monitor sends the retrieved relationships to the requestor. Advantageously, the system monitor facilitates determining the impact of a first software service on a second software service. In some implementations, the system monitor may provide a list of alternative resources that the first software service may use to reduce the impact of the first software service on the second software service.

In some implementations, the system monitor validates relationships stored in the model. The system monitor retrieves a relationship from the model. The relationship may include the first resource, the second resource and the entity linking the first resource with the second resource. The system monitor varies a property of the entity to trigger a state change of the first resource. The system monitor determines whether the state of the second resource changes within a threshold period of time. Finally, the system monitor validates the relationship in response to the second resource changing state within the threshold period of time. In some implementations, the system monitor purges the relationship when the second resource does not change state with the threshold period of time. Advantageously, the system monitor facilitates in maintaining the accuracy of the model by validating the relationships in the model and purging relationships that may be inaccurate.

In some implementations, the entity causing the state change of the first resource may include one of a power surge, a power drop, a current surge, a current drop, a voltage surge, a voltage drop, a change in temperature, a change in processing demand, or a change in memory demand. In other implementations, the entity causing the state change of the first resource may include one of a runtime error, a change in processing demand, a change in memory demand, a change in a number of virtual machines, a change in a number of application threads, or a change in a number of users using the software application.

Another aspect of the disclosure provides a distributed system including hardware resources, software resources residing in one or more of the hardware resources and a non-transitory memory residing in one or more of the hardware resources. The non-transitory memory stores a model modeling relationships among the hardware resources and the software resources. The distributed system further includes a model interface implemented on one or more of the hardware resources. The model interface, when executed on the one or more hardware resources, causes the one or more hardware resources to generate a representation of the model. In response to a request for a representation of at least a portion of the model, the model interface retrieves relationships affecting the organization from the model. The request originates from a requestor of an organization having several software applications and the request being associated with one of the software applications. After retrieving the relationships, the model interface categorizes each resource in the retrieved relationships as one of an organization resource, an infrastructure resource, an application resource, or a metadata resource. The model interface categorizes a resource as an organization resource when the resource affects all of the software applications of the organization. The model interface categorizes a resource as an infrastructure resource when the resource affects some of the software applications of the organization, but not all software applications of the organization. The model interface categorizes a resource as an application resource when the resource affects only the software application of the organization associated with the request. The model interface categorizes a resource as a metadata resource when the resource is available to the software application and the software application can use the resource to store metadata related to other resources. Finally, the model interface generates a representation of the retrieved and categorized relationships.

In some implementations, the model interface displays a graphical representation of the retrieved and categorized relationships as a directed graph. Moreover, the model interface displays indicia indicating the organization resources, the infrastructure resources, the application resources, and the metadata resources. In some examples, the indicia include separate colors for each category of resources.

In some implementations, the distributed system may include a system monitor that is implemented on one or more of the hardware resources. The system monitor, when executed on the one or more hardware resources, causes the one or more hardware resources to build the model. The system monitor detects a state change of a first resource of the distributed system and identifies an entity causing the state change of the first resource. Moreover, the system monitor determines whether a second resource of the distributed system changes state within a threshold period of time after the first resource changed state. Finally, the system monitor updates the model to indicate a relationship between the first resource, the second resource and the identified entity, in response to the first resource and the second resource changing state within the threshold time period. At least one of the first resource and the second resource includes a hardware resource of the distributed system in communication with the data processing device.

In some implementations, the entity causing the state change includes a hardware resource. In some implementations, the system monitor receives data from the first resource or the second resource indicating the relationship between the first resource and the second resource. Moreover, the system monitor updates the model to indicate the relationship between the first resource and the second resource. In other implementations, the system monitor receives data indicating the entity causing the change in state of the first resource.

In some implementations, the system monitor receives a request from a requestor in communication with the data processing device to determine an impact of a first software service on a second software service. The system monitor determines a first set of resources of the distributed system associated with the first software service. Moreover, the system monitor determines a second set of resources of the distributed system associated with the second software service. Additionally, the system monitor retrieves relationships between the first set of resources and the second set of resources from the model. Finally, the system monitor sends the retrieved relationships to the requestor. Advantageously, the system monitor facilitates determining the impact of a first software service on a second software service. In some implementations, the system monitor may provide a list of alternative resources that the first software service may use to reduce the impact of the first software service on the second software service.

In some implementations, the system monitor validates relationships stored in the model. The system monitor retrieves a relationship from the model. The relationship may include the first resource, the second resource and the entity linking the first resource with the second resource. The system monitor varies a property of the entity to trigger a state change of the first resource. The system monitor determines whether the state of the second resource changes within a threshold period of time. Finally, the system monitor validates the relationship in response to the second resource changing state within the threshold period of time. In some implementations, the system monitor purges the relationship when the second resource does not change state with the threshold period of time. Advantageously, the system monitor facilitates in maintaining the accuracy of the model by validating the relationships in the model and purging relationships that may be inaccurate or obsolete.

In some implementations, the first resource includes a software application. Moreover, the entity causing the state change of the first resource includes one of a runtime error, a change in processing demand, a change in memory demand, a change in a number of virtual machines, a change in a number of application threads, or a change in a number of users using the software application.

Yet another aspect of the disclosure provides a method for updating a model of a distributed system. The method includes detecting, using a data processing device, a state change of a first resource of a distributed system. The method further includes identifying, using the data processing device, an entity causing the state change of the first resource. Moreover, the method includes determining, using the data processing device, whether a second resource of the distributed system changes state within a threshold period of time after the first resource changed state. Finally, the method includes updating a model stored in non-transitory memory in communication with the data processing device to indicate a relationship between the first resource, the second resource and the identified entity, in response to the first resource and the second resource changing state within the threshold time period. In the method, at least one of the first resource and the second resource includes a hardware resource of the distributed system in communication with the data processing device.

In some implementations, identifying the entity includes identifying a software resource associated with the first resource and the second resource. In some examples, identifying the entity includes identifying a software application executing on a data processing device. In other examples, identifying an entity includes identifying an application programming interface stored in the memory. In yet other examples, identifying an entity includes identifying a library stored in the memory.

In some implementations, identifying the entity includes identifying a hardware resource connected to the first resource and the second resource. In some examples, identifying the hardware resource includes identifying a data processing device connected to the first resource via a network.

In some implementations, identifying the entity includes identifying an event causing the change in state of the first resource. In other implementations, identifying the entity includes receiving, via a receiver in communication with the data processing device, data indicating the entity causing the change in state of the first resource.

In some implementations, the method further includes receiving data from the first resource or the second resource indicating the relationship between the first resource and the second resource. Moreover, the method includes updating the model to indicate the relationship between the first resource and the second resource.

In some implementations, the method includes receiving a request to determine an impact of a first software service on a second software service. The method further includes determining a first set of resources of the distributed system associated with the first software service. Moreover, the method includes determining a second set of resources of the distributed system associated with the second software service. Additionally, the method includes retrieving relationships between the first set of resources and the second set of resources from the model. Finally, the method includes sending the retrieved relationships in response to the request.

In some implementations, the method validates relationships stored in the model. The method for validating relationships includes retrieving a relationship from the model. The relationship may include the first resource, the second resource and the entity linking the first resource with the second resource. The method further includes varying a property of the entity to change the first state of the first hardware resource. Moreover, determining whether the state of the second resource within the threshold time period. Finally, the method includes validating the relationship in response to the second resource changing state within the threshold time period. In some implementations, the method includes purging a relationship when the second resource does not change state within the threshold time period.

In some implementations, the method includes generating a representation of the model. The method includes receiving a request to return a representation of at least a portion of the model, the request originating from a requestor of an organization, the organization having several software applications and the request being associated with one of the software applications. The method further includes retrieving relationships affecting the organization from the model. Moreover, the method includes categorizing each resource in the retrieved relationships as one of an organization resource, an infrastructure resource, an application resource, or a metadata resource. The method includes categorizing the resource as an organization resource when the resource affects all of the software applications of the organization. Moreover, the method includes categorizing the resource as an infrastructure resource when the resource affects some of the software applications of the organization. Additionally, the method includes categorizing the resource as an application resource when the resource affects only the software application associated with the request. Finally, categorizing the resource as a metadata resource when the resource is available to the software application and the software application can use the resource to store metadata related to other resources. The method concludes by generating a representation of the retrieved and categorized relationships.

In some implementations, the method includes displaying a graphical representation of the retrieved and categorized relationships as a directed graph on a display in communication with the data processing device. Moreover, the method includes displaying indicia indicating the organization resources, the infrastructure resources, the application resources and the metadata resources.

DESCRIPTION OF DRAWINGS

Like reference symbols and the various drawings indicate like elements.

DETAILED DESCRIPTION

Figure 1:
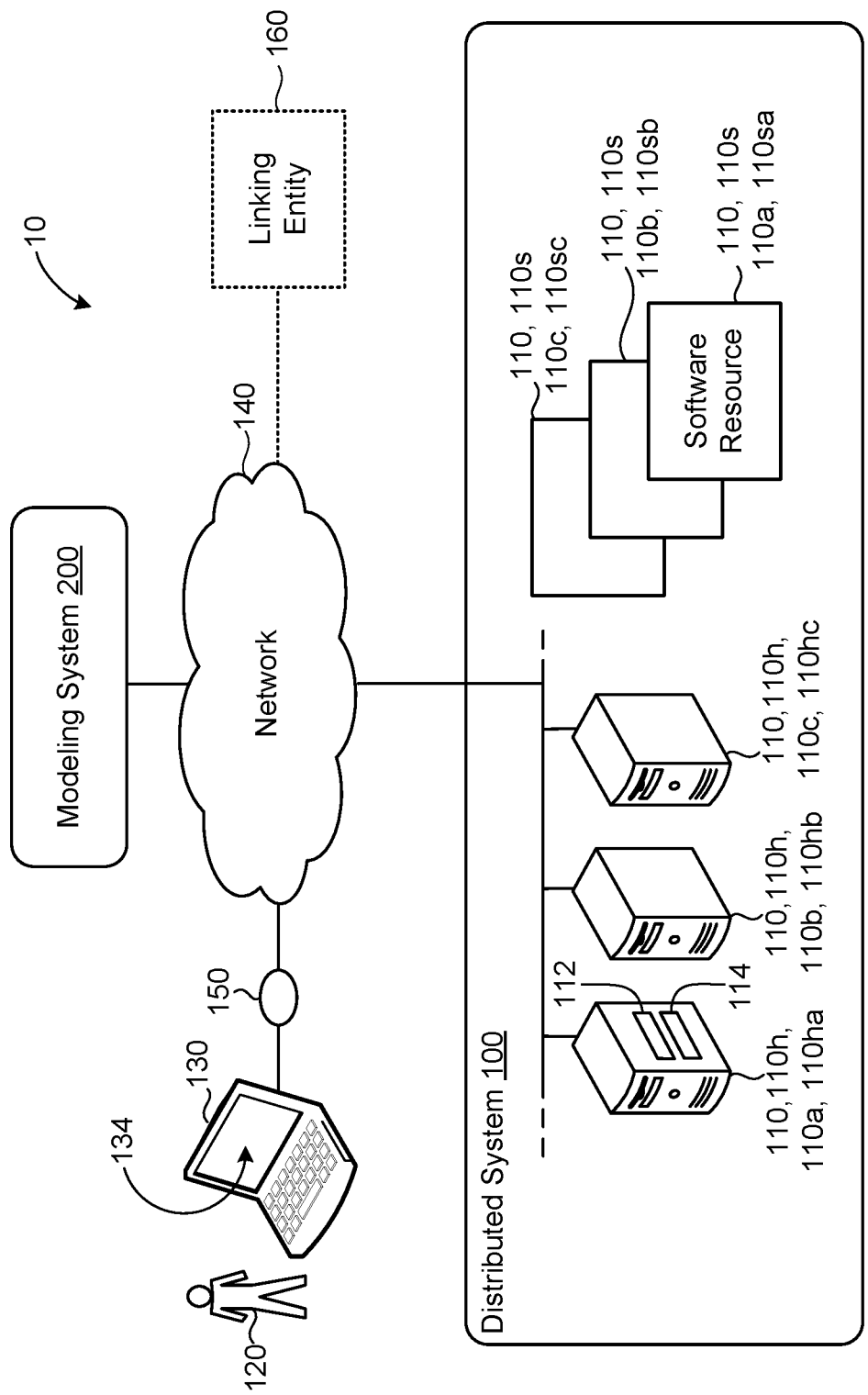
FIG. 1 is a block diagram of an example system for modeling a distributed system.

FIG. 1 depicts an example system 10 for generating a model of a distributed system 100. The system 10 includes the distributed system 100 and a modeling system 200. The modeling system 200 can access the distributed system 100 via a network 140. A user 120 may use a user computer 130 to access the distributed system 100 and/or the modeling system 200.

In some implementations, the distributed system 100 includes resources 110. The resources 110 may include hardware resources 110$h$ and software resources 110$s$. The hardware resources 110$h$ may include data processing devices 112 (also referred to as computing devices) or non-transitory memory 114. The software resources 110$s$ may include software applications, software services, application programming interfaces (APIs) or the like. The software resources 110$s$ may reside in the hardware resources 110$h$. For example, the software resources 110$s$ may be stored in the memory 114 or the hardware resources 110$h$ (e.g., the computing devices 112) may be executing the software resources 110$s$.

A software application (i.e., a software resource 110$s$) may refer to computer software that causes a computing device to perform a task. In some examples, a software application may be referred to as an "application," an "app," or a "program." Example applications include, but are not limited to, system diagnostic applications, system management applications, system maintenance applications, word processing applications, spreadsheet applications, messaging applications, media streaming applications, social networking applications, and gaming applications.

The non-transitory memory 114 may be physical devices used to store programs (e.g., sequences of instructions) or data (e.g., program state information) on a temporary or permanent basis for use by a computing device 112. The non-transitory memory 114 may be volatile and/or non-volatile addressable semiconductor memory. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

Although in the example of FIG. 1, the modeling system 200 is shown as being separate from the distributed system 100, in other implementations the modeling system 200 may be a part of the distributed system 100. In other words, the modeling system 200 may be implemented using the resources 110 of the distributed system 100.

Figure 2A:
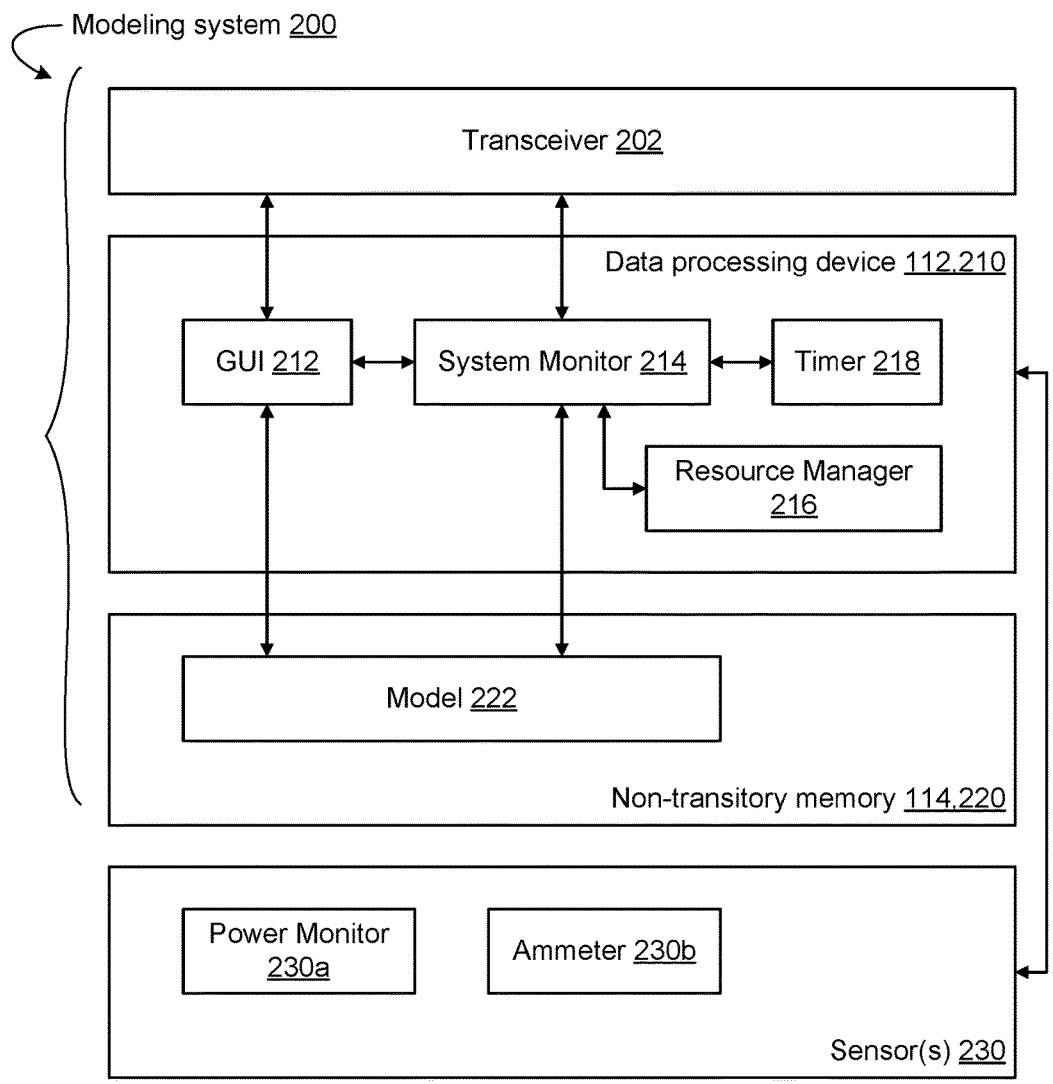
FIG. 2A is a block diagram of an example modeling system.

FIG. 2A illustrates an example modeling system 200. The modeling system 200 includes a transceiver 202, a data processing device 210 and a non-transitory memory 220. The transceiver 202 sends and/or receives data over the network 140. The transceiver 202 may include a wired transceiver (e.g., Ethernet) or a wireless transceiver (e.g., cellular, WiFi, Bluetooth or the like). The modeling system 200 can communicate with the distributed system 100 or the user computer 130 via the transceiver 202.

The data processing device 210 may include a graphical user interface (GUI) 212, a system monitor 214, a resource manager 216, and a timer 218. The non-transitory memory 220 may store a model 222 of the distributed system 100. The model 222 may store relationships between the resources 110 of the distributed system 100. The user 120 may access the model 222 via the GUI 212 when the GUI 212 is displayed on the user computer 130. The system monitor 214 may update the model 222 by modifying existing relationships in the model 222, adding new relationships to the model or purging existing relationships in the model 222. The system 10 may include one or more sensors 230 in communication with the data processing device 210 for determining state changes of resources 110 of the distributed system 100. In some examples, the system 10 includes a power monitor 230a that monitors a power consumption of a resource 110 and an ammeter 230b that monitors a current draw of a resource 110. Other sensors 230 are possible as well.

In some implementations, to help users 120 manage their applications 110s, the system monitor 214 auto-detects dependencies within the distributed system 100 and configures deployment pipelines for applications 110s to handle those dependencies, sets default system health alerts for developers, and/or compares similar code of applications 110s and offers suggestions for code optimizations that can be used in multiple components. The system monitor 214 may base its actions on relationships between resources 110, such as virtual machines 250, modules, projects, etc. and customer primitives, such as users 120, teams, communities, etc. The system monitor 214 may analyze relationships and distances between objects (e.g., resources 110) as well as usage patterns and use that information to build heuristics and make intelligent suggestions.

Figure 2B:
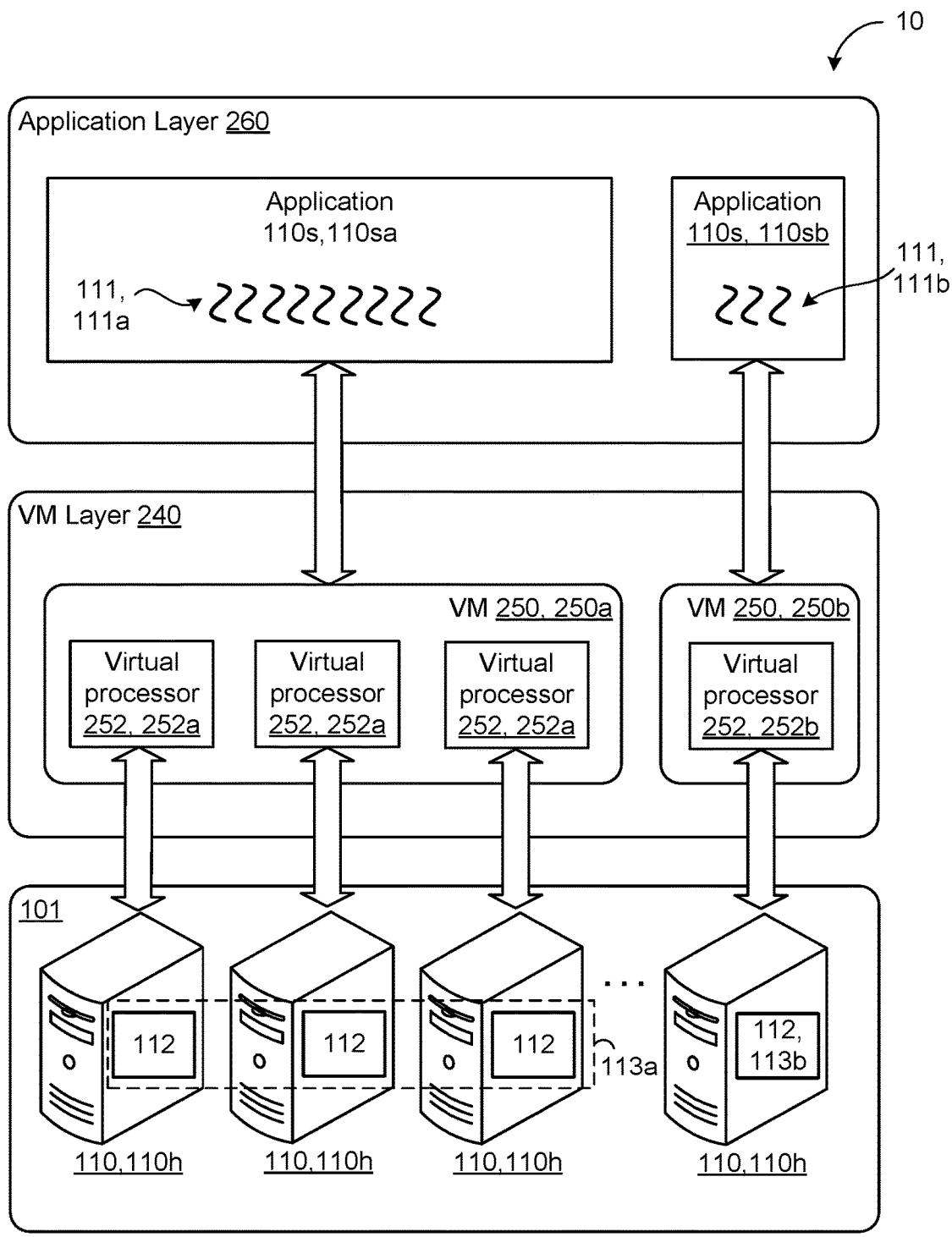
FIG. 2B is a block diagram of an example distributed system.

FIG. 2B illustrates executing software applications (i.e., a software resource 110s) in virtual machines. In some implementations, the system 10 includes a collection 101 of hardware resources 110h, a virtual machine (VM) layer 240 and application layer 260. Each hardware resources 110h may include one or more physical central processing units (pCPU) 112 ("physical processor 112", hereinafter). While the hardware resources 110h are shown as each including a single physical processor 112, the hardware resources 110h may include multiple physical processors 112.

The VM layer 240 includes one or more virtual machines 250. Each virtual machine 250 may include one or more virtual central processing units (vCPUs) 252 ("virtual processor 212", hereinafter). In the example shown, a first virtual machine 250a includes a first set 252a of one or more virtual processors 252 and a second virtual machine 250b includes a second set 252b of one or more virtual processors 252. While the second set 252b is shown as only including one virtual processor 252, any number of virtual processors 252 are possible. Each virtual processor 252 may emulate a physical processor 112. The first virtual processors 252a emulates a first set 113a of one or more physical processors 112, and the second virtual processor 252b emulates a second set 113b of one or more physical processors 112. The application layer 260 includes applications 110s that may execute in the virtual machine(s) 250.

Figure 3:
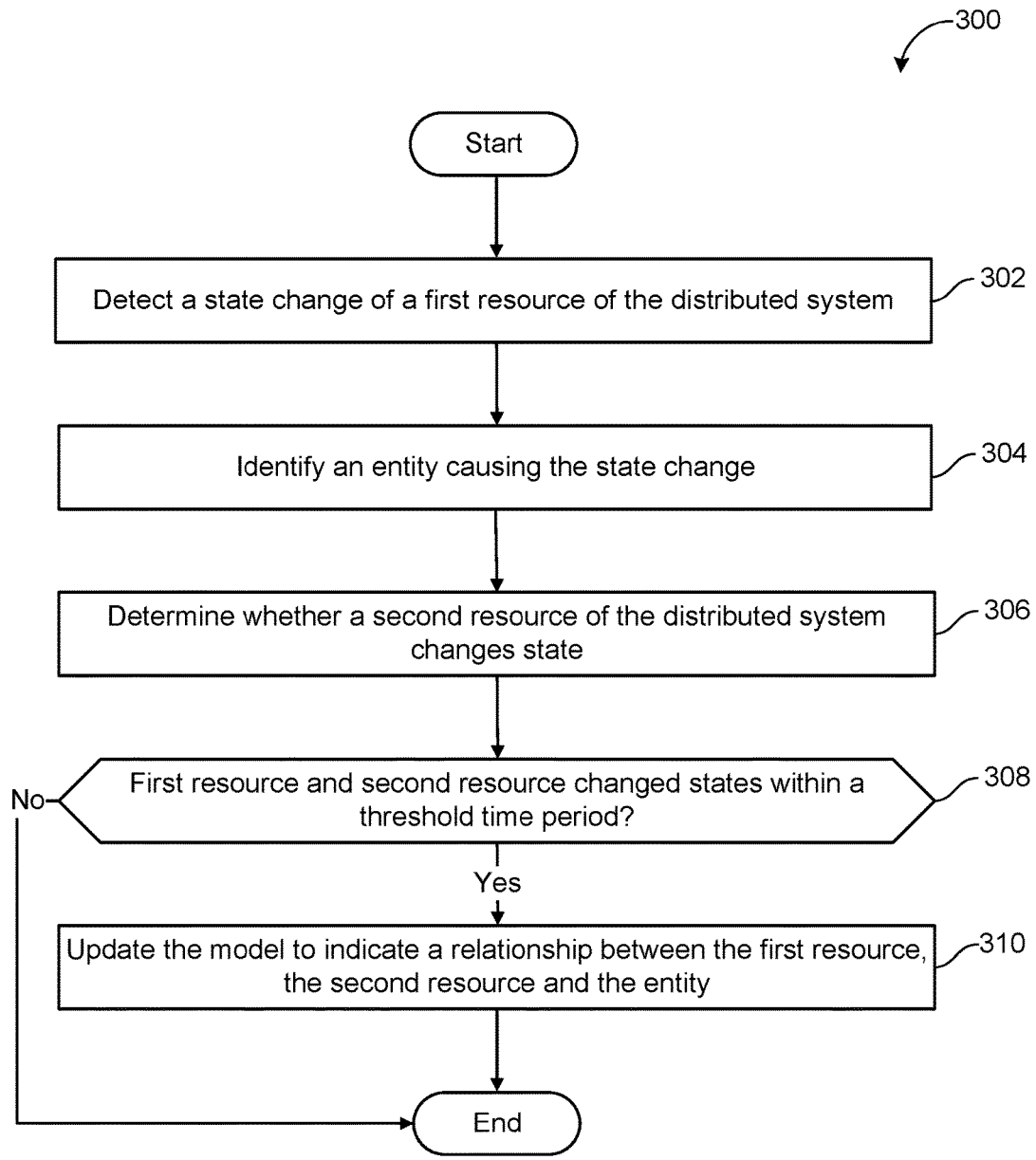
FIG. 3 is an example arrangement of operations for updating a model of a distributed system.

FIG. 3 illustrates an example method 300 for identifying relationships between the resources 110 and updating the model 222 to reflect the relationships. At 302 the system monitor 214 detects a state change of a first resource 110a of the distributed system 100. The first resource 110a may include a first hardware resource 110ha or a first software resource 110sa. The system monitor 214 may detect a state change of the first resource 110a when any measurable characteristic of the first resource 110a changes.

An example of a measurable characteristic of the first hardware resource 110ha is an amount of power consumed by the first hardware resource 110ha. The system monitor 214 may detect a state change of the first hardware resource 110ha when a change in the amount of power consumed by the first hardware resource 110ha exceeds a threshold power change percentage (e.g., 50%). In some implementations, using the power monitor 230a, the system monitor 214 detects a state change of the first hardware resource 110ha when the first hardware resource 110ha experiences a power spike or a power drop. Additionally or alternatively, the system monitor 214 may detect a state change when the first hardware resource 110ha experiences a power loss.

In some implementations, the system monitor 214 detects a state change of the first hardware resource 110ha when a change in the amount of current being drawn by the first hardware resource 110ha exceeds a threshold current change percentage (e.g. 100%). The distributed system 100 may include an ammeter 230b measuring a current drawn by the first hardware resource 110ha. The distributed system 100 may send the measured current to the modeling system 200 via the network 140.

Another example of a measureable characteristic of the first hardware resource 110ha is a processing load of the first hardware resource 110ha. The system monitor 214 may determine the processing load of the first hardware resource 110ha by determining a percentage of time that the first hardware resource 110ha is busy executing instructions during a time period. Alternatively, the system monitor 214 may determine the processing load of the first hardware resource 110ha by determining a percentage of time that the first hardware resource 110ha is idle during a time period (i.e., not executing instructions). The system monitor 214 may detect a state change of the first hardware resource 110*ha* when a change in the processing load exceeds a threshold processing change (e.g., 80%). Alternatively or additionally, the system monitor 214 may detect a state change when the first hardware resource 110*ha* halts the execution of instructions.

Yet another example of a measureable characteristic of the first hardware resource 110*ha* is a memory load of the first hardware resource 110*ha*. The system monitor 214 may determine the memory load of the first hardware resource 110*ha* by determining a percentage of memory of the first hardware resource 110*ha* storing data. The system monitor 214 may detect a state change of the first hardware resource 110*ha* when a change in the memory load exceeds a threshold memory change (e.g., 50%). Alternatively or additionally, the system monitor 214 may detect a state change when the memory load exceeds a threshold memory load (e.g., 99%).

Another example of a measureable characteristic of the first hardware resource 110*ha* is a temperature of the first hardware resource 110*ha*. The distributed system 100 may include a thermometer to measure the temperature of the first hardware resource 110*ha*. The distributed system 100 may periodically send temperature measurements of the first hardware resource 110*ha* to the modeling system 200. The system monitor 214 may detect a state change when a change in temperature exceeds a threshold temperature change. Alternatively or additionally, the system monitor 214 may detect a state change when the temperature exceeds a threshold temperature limit.

Another example of a measureable characteristic of the first hardware resource 110*ha* is a noise level of the first hardware resource 110*ha*. The distributed system 100 may include a noise sensor to measure an amount of noise the first hardware resource 110*ha* produces. The distributed system 100 may periodically send noise measurements of the first hardware resource 110*ha* to the modeling system 200. The system monitor 214 may detect a state change when a change in noise exceeds a threshold noise change. Alternatively or additionally, the system monitor 214 may detect a state change when the noise exceeds a threshold noise limit.

In some implementations, the distributed system 100 may include other sensors for detecting any malfunctions in the first hardware resource 110*ha*. The distributed system 100 may send sensor measurements from the sensors to the modeling system 200. The system monitor 214 may detect a state change in response to the sensor measurements deviating from threshold sensor measurements.

An example of a measureable characteristic of the first software resource 110*sa* is an amount of processing resources the first software resource 110*sa* uses. The system monitor 214 may determine the amount of processing resources the first software resource 110*sa* uses by determining a number of hardware resources 110*h* executing instructions related to the first software resource 110*sa*. The system monitor 214 may detect a state change in the first software resource 110*sa* when a change in the amount of processing resources exceeds a threshold processing power change (e.g., 1000%). As an example, if the number of hardware resources 110*h* executing instructions related to the first software resource 110*sa* increases by a factor of ten within a very short period of time, then the system monitor 214 may detect a state change in the first software resource 110*sa*.

In some implementations, the system monitor 214 may detect a state change of the first software resource 110*sa* based on a change in the number of virtual machines 250 executing instructions related to the first software resource 110*sa*. The system monitor 214 detects a state change of the first software resource 110*sa* when the change in the number of virtual machines 250 executing the first software resource 110*sa* exceeds a threshold virtual machine change (e.g., 1000%). As an example, if the number of virtual machines 250 executing instructions related to the first software resource 110*sa* increases by a factor of ten within a very short period of time, then the system monitor 214 may detect a state change in the first software resource 110*sa*.

Referring also to FIG. 2B, the system monitor 214 may detect a state change of the first software resource 110*sa* based on a change in the number of application threads 111 associated with the first software resource 110*sa*. The system monitor 214 detects a state change of the first software resource 110*sa* when the change in the number of application threads 111 exceeds a threshold application thread change (e.g., 1000%). As an example, if the number of application threads 111 associated with the first software resource 110*sa* increases by a factor of ten within a very short period of time, then the system monitor 214 may detect a state change in the first software resource 110*sa*.

In the example shown in FIG. 2B, a first application 110*sa* having application threads 111*a* executes in a first virtual machine 250*a* and a second application 110*sb* having application threads 111*b* executes in a second virtual machine 250*b*. In some implementations, the application threads 111 are separable or divisible chunks of the application 110*s* that can be executed on different virtual processors 212. The application 110*s* may identify the application threads 111 or, alternatively, the virtual machine 250 executing the application 110*s* may identify the application threads 111 in the application 110*s*. The application 110*s* may identify the application threads 111 by separating the application threads 111 with a marker. Additionally or alternatively, the application 110*s* may specify the number of application threads 111, for example as metadata. By segregating the application 110*s* into separately executable application threads 111 the application 110*s* can be executed using multiple virtual processors 252.

In the example shown, the first application 110*sa* may require more virtual processors 252 than the second application 110*sb*. Accordingly, the first virtual machine 250*a* executing the first application 110*sa* with more application threads 111*a* includes a first set 252*a* of three virtual processors 252, whereas the second virtual machine 250*b* executing the second application 110*sb* with fewer application threads 111*b* includes a second set 252*b* of only a single virtual processor 252. The first virtual machine 250*a* allocates the application threads 111*a* of the first application 110*sa* to each of the virtual processors 252 in the first virtual machine 250*a*. Since the first set 252*a* of virtual processors 252 emulates the corresponding first set 113*a* of physical processors 112, once the first virtual machine 250*a* allocates the first application threads 111*a* to the associated virtual processors 252, 252*a*, the first set 113*a* of physical processors 112 execute the allocated application threads 111*a*.

In some implementations, the number of application threads 111 may vary while the virtual machine 250 executes the application 110*s*. In some scenarios, the number of application threads 111 may increase. The number of application threads 111 may increase for a variety of reasons, for example, more users may start using the application 110*s*, the application 110*s* may be receiving more data from the user or the application 110*s* may be performing a task that requires more application threads 111. If the number of application threads 111 increases and the number of virtual processors 252 remains constant, then the existing virtual processors 252 handle the additional application threads 111. The system monitor 214 may detect the increased load of application threads 111 on the virtual processors 252 and cause allocation of additional virtual processors 252 to handle the increased load of application threads 111.

In some implementations, the system monitor 214 detects a state change of the first software resource 110sa based on a change in an amount of memory 114 that the first software resource 110sa uses. If the change in memory usage exceeds a threshold memory change (e.g., 1000%), then the system monitor 214 may detect a state change of the first software resource 110sa. In some implementations, the system monitor 214 detects a state change of the first software resource 110sa in response to an error in executing instructions related to the first software resource 110sa, for example a run-time error. The system monitor 214 may detect a state change of the first software resource 110sa, if the first software resource 110sa crashes or stops executing. In some implementations, the system monitor 214 detects a state change when a number of users 120 using the first software resources 110sa increases beyond a threshold number of users (e.g., more than 100 million users).

Referring again to FIG. 2A, in some implementations, the resource manager 216 (e.g., executing on a hardware resource 110h) monitors activities of software resources 110s. The resource manager 216 may, for example, monitor the amount of memory 114 being used by a software resource 110s and/or the amount of processing resources 112 being used by a software resource 110s. Moreover, the resource manager 216 may monitor the number of virtual machines 250 executing a software resource 110s. The resource manager 216 communicates any changes in the activities of software resources 110s to the system monitor 214.

Referring again to FIG. 3, at 304, the system monitor 214 identifies an entity causing the state change of the first resource 110a. In some implementations, the system monitor 214 identifies the entity as the measurable characteristic that triggered the state change. For example, if a change in the amount of power that the first hardware resource 110ha consumes triggered the state change, then the system monitor 214 may identify power as the entity causing the state change. Similarly, if a change in the temperature of the first hardware resource 110ha triggered the state change, then the system monitor 214 may identify temperature as the entity causing the state change.

In some implementations, the system monitor 214 identifies the entity as a resource 110 interacting with the first resource 110a immediately before the state change. The system monitor 214 may identify the entity as a software resource 110s executing on the first hardware resource 110ha immediately before the state change. In additional examples, the system monitor 214 identifies the entity as a software resource 110s storing data in the first hardware resource 110ha immediately before the state change.

At 306, the system monitor 214 determines whether a second resource 110b of the distributed system 100 changes state. The system monitor 214 may detect a state change of the second resource 110b in the same way the system monitor 214 detects state changes of the first resource 110a. In some implementations, the system monitor 214 identifies a second resource 110b that has experienced a similar type of state change as the first resource 110a. For example, if the first resource 110a changed state due to a power surge, then the system monitor 214 identifies a second resource 110b that changed states due to a power surge. Similarly, if the first resource 110a changed states due to a sudden increase in the number of virtual machines 250, then the system monitor 214 identifies a second resource 110b that changed states due to an increase in the number of virtual machines 250. In other implementations, the type of state change of the first resource 110a and the second resource 110b may be different.

At 308, the system monitor 214 determines whether the state changes of the first resource 110a and the second resource 110b occurred within a threshold time. The system monitor 214 may use the timer 218 to record a first time at which the state change of the first resource 110a occurred and a second time at which the state change of the second resource 110b occurred. The system monitor 214 may determine a difference between the first time and the second time. The system monitor 214 may then compare the difference with the threshold time. In some implementations, if the difference is less than the threshold time, then the system monitor 214 determines that there is a relationship between the first resource 110a and the second resource 110b. The system monitor 214 may further determine that the relationship between the first resource 110a and the second resource 110b is caused by the entity triggering the state changes.

At 310, the system monitor 214 updates the model 222 stored in the memory 220 to indicate the relationship between the first resource 110a, the second resource 110b and the entity triggering the state changes. The system monitor 214 may update the model 222 by adding a new record in the model 222 to indicate the relationship.

Figure 4:
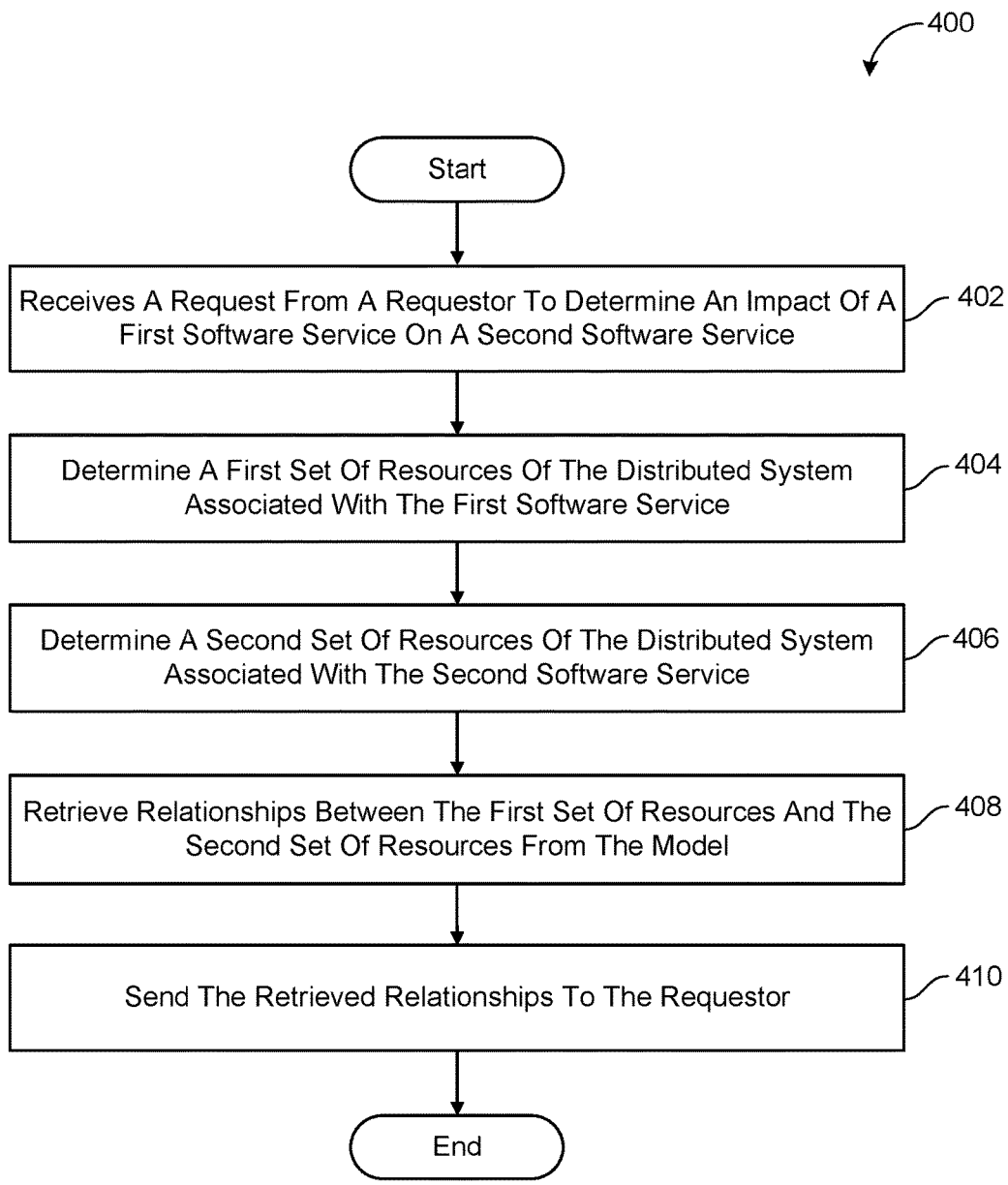
FIG. 4 is an example arrangement of operations for querying a model of a distributed system.

FIG. 4 illustrates a method 400 for querying the model 222. With additional reference to FIG. 1, the distributed system 100 may facilitate hosting of software services, such as internet search, navigational maps, executing applications and hosting virtual machines, etc. At 402, the system monitor 214 receives a request 150 from a requestor (e.g., the user 120 or the user computer 130) to determine an impact of a first software service (e.g., a first software resource 110sa) on a second software service (e.g., a second software resource 110sb). The requestor 120, 130 may include a resource manager, a software developer, a user of a software service or the software service itself. For example, a software developer of an internet search service may send a request to determine the impact of the internet search service on a map service. In another example, a maps application may have requested a resource manager to implement an additional ten virtual machines to execute the maps application and the resource manager may request the system monitor 214 to determine the impact of implementing the additional ten virtual machines on a search application.

At 404, the system monitor 214 determines a first set 110a of resources 110 of the distributed system 100 that are associated with the first software service 110sa. In some implementations the system monitor 214 may determine a list of hardware resources 110ha and a list of software resources 110s that are used by the first software service 110sa. At 406, the system monitor 214 determines a second set 110b of resources 110 of the distributed system 100 associated with the second software service 110sb. In some implementations, the system monitor 214 may provide a list of hardware resources 110h and software resources 110s that execute instructions related to the second software service 110sb.

At 408, the system monitor 214 retrieves relationships between the first set 110a of resources 110 and the second set 110b of resources 110 from the model 222. At 410, the system monitor 214 sends the retrieved relationships to the requestor 120, 130 via the transceiver 202. By sending the relationships between the first set 110*a* and the second set 110*b*, the system monitor 214 notifies the requestor 120, 130 the ways in which the first software service 110*sa* may impact the second software service 110*sb*. If the system monitor 214 determines that there are no relationships between the first set 110*a* and the second set 110*b*, then the system monitor 214 may notify the requestor 120, 130 that the first software service 110*sa* does not impact the second software service 110*sb*.

In some implementations, the system monitor 214 may identify alternative resources 110 that are available to the first software service 110*sa* and that would eliminate or reduce the impact on the second software service 110*sb*. Advantageously, the requestor 120, 130 may migrate the first software service 110*sa* to the alternative resources 110, so that the first software service 110*sa* does not impact the second software service 110*sb*. In other implementations, the system monitor 214 may provide a list of alternative resources 110 that the first software service 110*sa* may use to reduce the impact of the first software service 110*sa* on the second software service 110*sb*.

Figure 5:
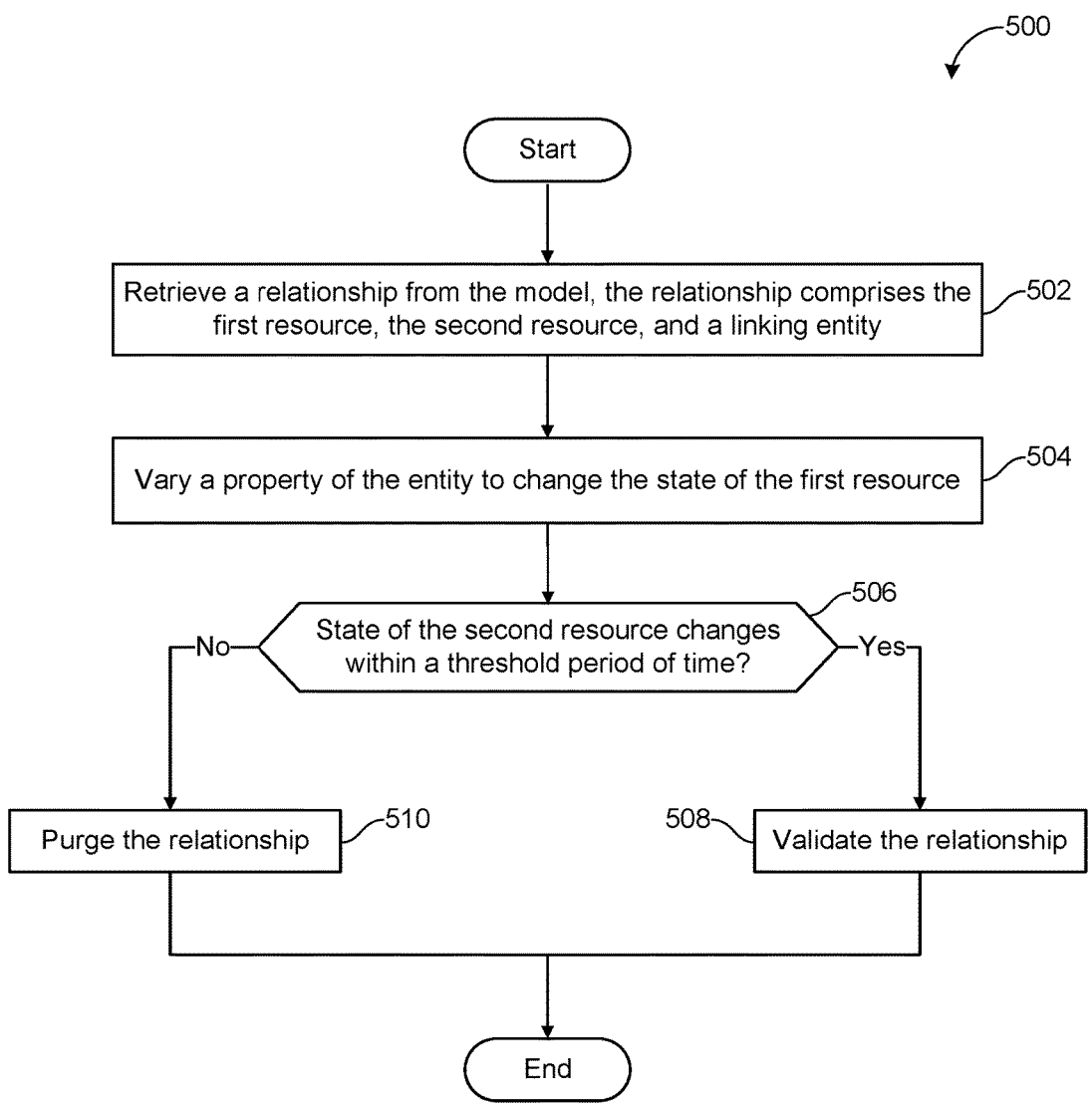
FIG. 5 is an example arrangement of operations for validating a model of a distributed system.

FIG. 5 illustrates a method 500 for validating relationships in the model 222. With additional reference to FIG. 1, at 502, the system monitor 214 retrieves a relationship from the model 222. The relationship includes a first resource 110*a*, a second resource 110*b* and a linking entity 160 that links the first resource 110*a* and second resource 110*b*. The linking entity 160 is an entity, physical or transient, (e.g., a resource 110, hardware resource 110*h*, software resource 110*s*, user 120, user computer 130, network 140, a request 150, power surge, processing load, a measurable event, etc.) that causes state changes in both the first resource 110*a* and the second resource 110*b*.

At 504, the system monitor 214 varies a property of the linking entity 160 to trigger a state change of the first resource 110*a*. For example, if the linking entity 160 is power surge, then the system monitor 214 causes a power surge to trigger a state change of the first resource 110*a*. In other examples, if the linking entity is processing load, then the system monitor 214 may increase the processing load of the first resource 110*a* to trigger a state change of the first resource 110*a*. The system monitor 214 may increase the processing load of the first resource 110*a* by assigning computationally-intensive processing jobs to the first resource 110*a*.

At 506, the system monitor 214 determines whether the state of the second resource 110*b* changes within a threshold period of time after the first resource 110*a* changes state. If the second resource 110*b* changes state within the threshold period of time then, at 508, the system monitor 214 validates the relationship. If the second resource 110*b* does not change state within the threshold period of time, then the system monitor 214 may purge the relationship at 510.

As the distributed system 100 changes over time, some relationships in the model 222 may change as well. For example, as the number of hardware resources 110*h* increases in the distributed system 100 the impact of a current spike may be dampened because there are more hardware resources 110*h* to withstand the current spike. Due to the dynamic nature of relationships, it is beneficial to verify the relationships from time-to-time and update the model 222 as needed. Advantageously, by validating and purging the relationships in the model 222, the system monitor 214 keeps the model 222 updated.

Figure 6:
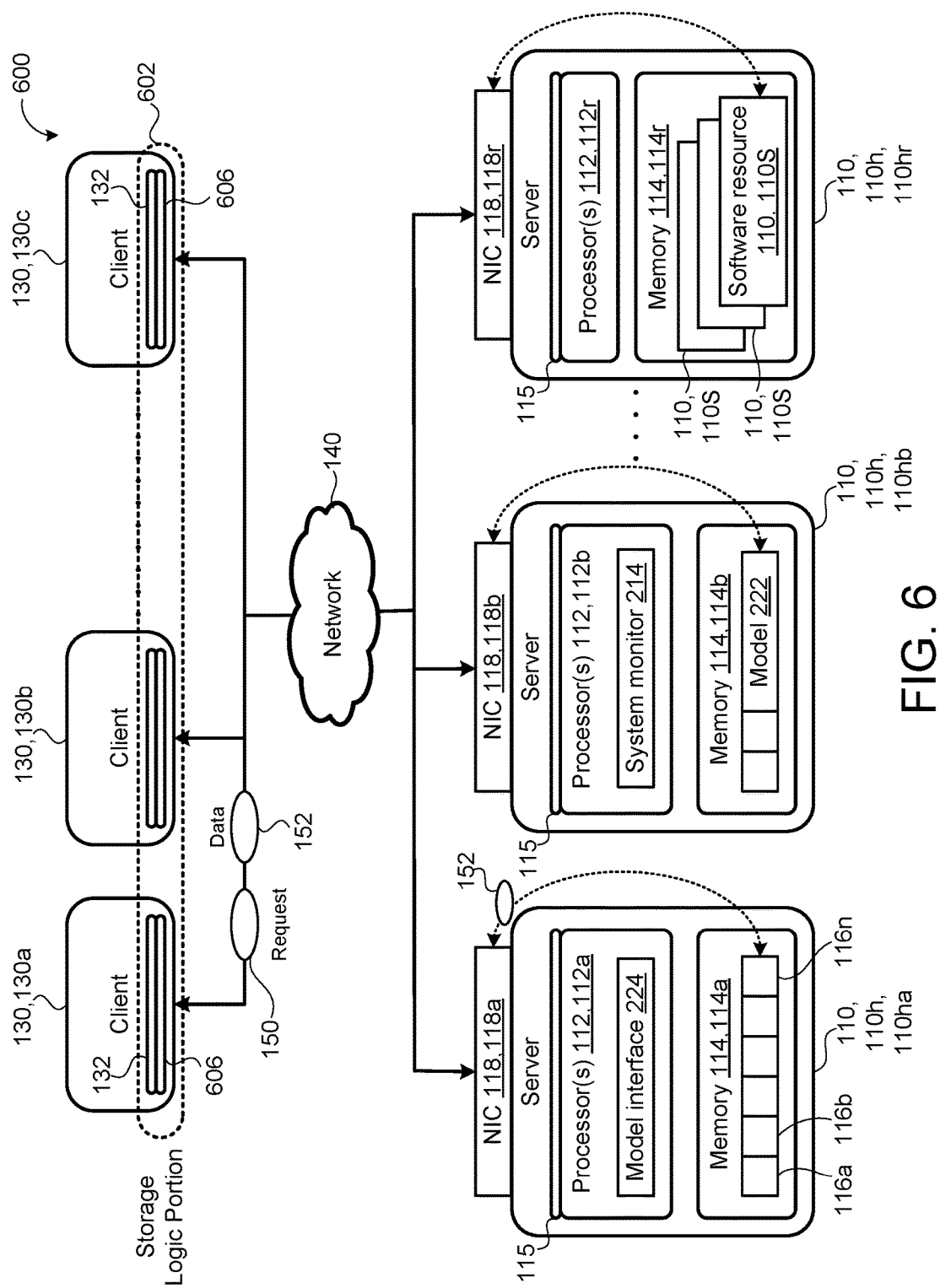
FIG. 6 is a block diagram of an example distributed system.

FIG. 6 illustrates an example distributed system 600. The distributed system 600 includes resources 110. The resources 110 include loosely coupled hardware resources 110*h* (e.g., data processing devices such as computers or servers), each having a physical processor 112 (e.g., one or more central processing units (CPUs) or other computing resource) in communication with storage resources 114 (e.g., memory, flash memory, dynamic random access memory (DRAM), phase change memory (PCM), and/or disks having spindles) that may be used for caching data 152. A storage abstraction (e.g., key/value store or file system) overlain on the storage resources 114 allows scalable use of the storage resources 114 by one or more clients 130, 130*a-n* (e.g., user computers). The clients 130 may communicate with the resources 110 through a network 140 (e.g., via RPC).

The distributed system 600 may include multiple layers of redundancy where data 152 is replicated and/or encoded and stored in multiple data centers. Data centers (not shown) house computer systems and their associated components, such as telecommunications and storage systems. Data centers usually include backup power supplies, redundant communications connections, environmental controls (to maintain a constant temperature), and security devices. Data centers may be large industrial scale operations that use a great amount of electricity (e.g., as much as a small town). Data centers may be located in different geographical locations (e.g., different cities, different countries, and different continents). In some examples, the data centers, or portions thereof, requires maintenance (e.g., due to a power outage or disconnecting a portion of the storage system for replacing parts, or a system failure, or a combination thereof). The data 152 stored in these data centers, and in particular, the distributed system 600 may be unavailable to users/clients 120, 130 during the maintenance period resulting in the impairment or halt of a user's operations. Therefore, it is desirable to provide a distributed system 600 capable of efficiently using the storage resources 114 of the hardware resources 110*h* during maintenance and/or certain data center hardware/software failures without moving the data 152 in advance of such a maintenance or failure. The system 600 may adjust a load of the available resources 110, and jobs of the adjusted load may be executed in a predefined order, such as high-availability jobs before the low-availability jobs.

In some implementations, the distributed system 600 is "single-sided," eliminating the need for any server jobs for responding to remote procedure calls (RPC) from clients 130 to store or retrieve data 152 on their corresponding hardware resources 110*h* and may rely on specialized hardware to process remote requests 150 instead. "Single-sided" refers to the method by which most of the request processing on the hardware resources 110*h* may be done in hardware rather than by software executed on physical processors 112 of the hardware resources 110*h*. Rather than having a physical processor 112 of a hardware resource 110*h* (e.g., a server) execute a server process 115 that exports access of the corresponding storage resource 114 (e.g., non-transitory memory) to client processes 132 executing on the clients 130, the clients 130 may directly access the storage resource 114 through a network interface controller (NIC) 118 of the hardware resource 110*h*. In other words, a client process 132 executing on a client 130 may directly interface with one or more storage resources 114 without requiring execution of a routine of any server processes 115 executing on the physical processors 112.

This single-sided distributed storage architecture offers relatively high-throughput and low latency, since clients 130 can access the storage resources 114 without interfacing with the physical processors 112 of the hardware resources 110h. This has the effect of decoupling the requirements for storage 114 and CPU cycles that typical two-sided distributed systems carry. The single-sided distributed system 600 can utilize remote storage resources 114 regardless of whether there are spare CPU cycles on that hardware resource 110h; furthermore, since single-sided operations do not contend for server physical processor 112 resources, a single-sided system can serve cache requests 150 with very predictable, low latency, even when hardware resources 110h are running at high CPU utilization. Thus, the single-sided distributed system 600 allows higher utilization of both cluster storage 114 and physical processor 112 resources than traditional two-sided systems, while delivering predictable, low latency.

In some implementations, the distributed system 600 includes a storage logic portion 602, (e.g., encoding system), a data control portion, and a data storage portion. The storage logic portion 602 may include a transaction application programming interface (API) 606 (e.g., a single-sided transactional system client library) that is responsible for accessing the underlying data 152, for example, via RPC or single-sided operations. The data control portion may manage allocation and access to storage resources 114 with tasks, such as allocating storage resources 114, registering storage resources 114 with the corresponding network interface controller 118, setting up connections between the client(s) 130 and the hardware resources 110h, handling errors in case of machine failures, etc. The data storage portion may include the loosely coupled hardware resources 110h.

The distributed system 600 may store data 152 in dynamic random access memory (DRAM) 114 and serve the data 152 from the remote hardware resource 110h via remote direct memory access (RDMA)-capable network interface controllers 118. A network interface controller 118 (also known as a network interface card, network adapter, or LAN adapter) may be a computer hardware component that connects a physical processor 112 to the network 140. Both the hardware resources 110h and the clients 130 may each have a network interface controller 118 for network communications. A host process 115 executing on the physical processor 112 of the hardware resource 110h registers a set of remote direct memory accessible regions 116a-n of the memory 114 with the network interface controller 118. The host process 115 may register the remote direct memory accessible regions 116a-n of the memory 114 with a permission of read-only or read/write. The network interface controller 118 of the hardware resource 110h creates a client key for each registered memory region 116a-n.

The single-sided operations performed by the network interface controllers 118 may be limited to simple reads, writes, and compare-and-swap operations, none of which may be sophisticated enough to act as a drop-in replacement for the software logic implemented by a traditional cache server job to carry out cache requests and manage cache policies. The transaction API 606 translates commands, such as look-up or insert data commands, into sequences of primitive network interface controller operations. The transaction API 606 interfaces with the data control and data storage portions of the distributed system 600.

The distributed system 600 may include a co-located software process to register memory 114 for remote access with the network interface controllers 118 and set up connections with client processes 132. Once the connections are set up, client processes 132 can access the registered memory 114 via engines in the hardware of the network interface controllers 118 without any involvement from software on the local physical processors 112 of the corresponding local hardware resources 110h.

In the example of FIG. 6, the distributed system 600 includes a first hardware resource 110ha and a second hardware resource 110hb. The first hardware resource 110ha includes a first physical processor 112a, a first memory 114a and a first NIC 118a. Similarly, the second hardware resource 110hb includes a second physical processor 112b, a second memory 114b and a second NIC 118b. The distributed system 600 may include a remote hardware resource 110hr. The remote hardware resource 110hr may be located at a different location that the first hardware resource 110ha and the second hardware resource 110hb (e.g., in a different city, state, country or continent). The remote hardware resource 110hr includes a remote physical processor 112r, a remote memory 114r and a remote NIC 118r.

The second memory 114b stores a model 222. The model 222 stores relationships between the resources 110 of the distributed system 600. The second physical processor 112b implements a system monitor 214 that manages the model 222. The system monitor 214 can update the model 222 by modifying existing relationships stored in the model 222, purging existing relationships stored in the model 222 or adding new relationships to the model 222. The first processor 112a implements a model interface 224. The model interface 224 can access the model 222 even though the model interface 224 and the model 222 are in different hardware resources 110h. Further, the model interface 224 may access the model 222 directly through the NIC 118b without communicating with the second physical processor 112b. Advantageously, the model interface 224 can access the model 222 even when the second physical processor 112b may be unavailable or busy. The clients 130 can access the model 222 through the model interface 224.

The system monitor 214 can detect state changes in resources 110 including hardware resources 110h and software resources 110s stored in the remote memory 114r. The system monitor 214 may detect state changes of the software resources 110s via the remote NIC 118r without communicating with the remote physical processor 112r. Advantageously, the system monitor 214 can detect state changes of the software resources 110s even when the remote physical processor 112r is unavailable or busy. In the example of FIG. 6, the distributed system 600 is configured to maintain and update the model 222. In other words, unlike the example system 10 depicted in FIG. 1, the modeling system is a part of the distributed system 600.

Figure 7:
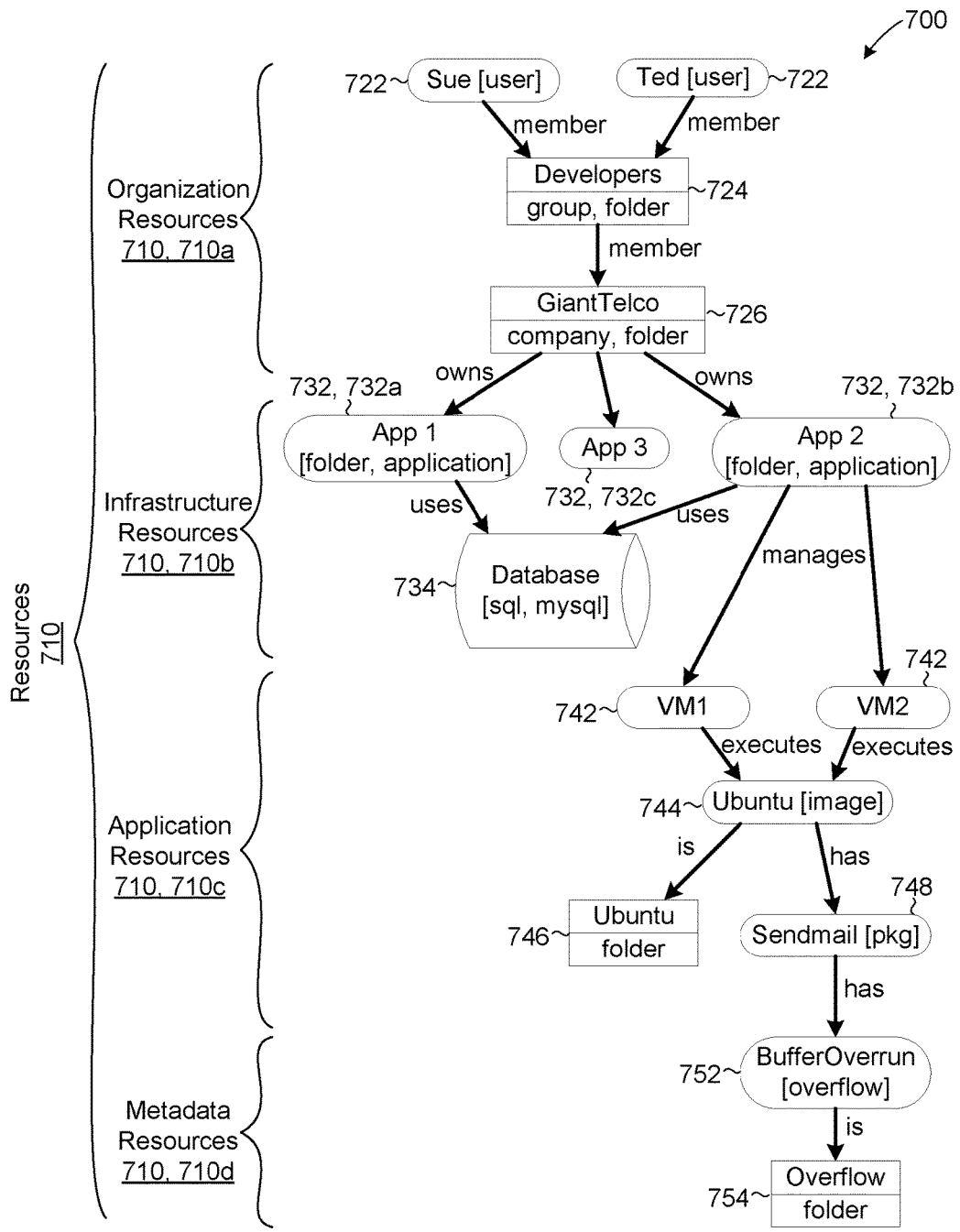
FIG. 7 is an example graphical user interface for viewing a representation of a model of a distributed system.

FIG. 7 illustrates an example representation 700 of at least a portion of the model 222. The model interface 224 may display the representation 700 through a graphical user interface (GUI) 134 on a client 130 (FIG. 1) or the GUI 220 of the modeling system 200. The model interface 224 may display the representation 700 through a website. The representation 700 displays resources 710. The model interface 224 may categorize the resources 710 into categories. The model 222 may allow labeling of resources 110, creation of labeled edges relating one resource 110 to another resource 110. The model may include purely metadata elements, which may be used to structure other elements in the model 222. In some implementations, the model interface includes a query system that allows user s 120 to query resources 110 or post questions related to certain resources 110. Moreover, the modeling system 200 may include a constraint system that prevents the display of invalid or contradictory information or portions of the representation 700.

In the example of FIG. 7, the model interface 224 categorizes the resources 710 into four categories: organization resources 710a, infrastructure resources 710b, application resources 710c and metadata resources 710d. Other categories are also contemplated, for example package resources, virtual machine resources, overflow resources, etc.

An organization may have several software applications. Some resources 710 may be available to all the software applications of the organization. The model interface 224 may categorize resources 710 that are available to and/or utilized by all software applications of the organization as organization resources 710a. Some resources 710 may be available to some of the software applications, but not all of the software applications. The model interface 224 may categorize resources 710 that are available to and/or utilized by some software applications, but not all software applications as infrastructure resources 710b. Some resources 710 may be available to and/or utilized by a single software application and not by other software applications. The model interface 224 may categorize resources 710 that are used by and/or utilized by a single software application and not by other software applications as application resources 710c. Some resources 710 may be available to a software application for the software application to store metadata related to other resources 710. The model interface 224 may categorize resources 710 that are available to a software application for storing metadata as metadata resources 710d. In some examples, a metadata resource 710d may include an overflow resource that may be available to a software application but the software application may not be using. The model interface 224 may categorize resources 710 that are available to a software application but not being used by the software application as overflow resources.

In the example of FIG. 7, organization resources 710a include users 722. The model interface 224 categorizes the users 722 as organization resources 710a, because the users 722 can access all resources 710 within the organization. The users 722 are members of a developer group 724. The model interface 224 categorizes the developer group 724 as an organization resource 710a, because the developers in the developer group 724 can develop applications for the organization. The developer group 724 is a member of the organization 726. The organization 726 owns applications 732.

In the example of FIG. 7 there are three applications 732: a first application 732a; a second application 732b; and a third application 732c. The first application 732a and the second application 732b use a database 734. The model interfaced 224 categorizes the database 734 as an infrastructure resource 710b and not an organization resource 710a, because the database 734 is used by some applications 732 (i.e., the first application 732a and the second application 732b), but not by all applications 732 (i.e., not by the third application 732c). The second application 732b manages virtual machines 742. The model interface 224 categorizes the virtual machines 742 as application resources 710c, because the virtual machines 742 are only used by a single application: the second application 732b.

The virtual machines 742 execute an image 744. The image 744 may be an image of an operating system, for example Ubuntu. The image 744 includes an image folder 746. The image 744 may include a package 748 (e.g., a mail package that is used to send e-mail). The model interface 224 categorizes the image 744, the image folder 746 and the package 748 as application resources 710c because only the second application 732b has access to the image 744, the image folder 746 and the package 748.

The package 748 has access to a buffer overrun resource 752. The model interface 224 categorizes the buffer overrun resource 752 as a metadata resource 710d, because the package 748 does not routinely use the buffer overrun resource 752, but the buffer overrun resource 752 is available to the package 748 in case of a buffer overrun event. The buffer overrun resource 752 may include an overflow folder 754. Further, the buffer overrun resource 752 can store metadata related to the package 748. For example, the buffer overrun resource 752 may store information indicating that the package 748 has a security leak and the security leak is causing a buffer overrun.

In the example of FIG. 7, the model interface 224 displays the representation 700 of the model 222 as a directed graph in which the model interface 224 displays the resources 710 as nodes of a directed graph. The model interface 224 further displays directed arrows extending between the nodes. In other implementations, the model interface 224 may display the representation 700 as a Venn diagram in which the metadata resources 710d may be included inside the application resources 710c, the application resources 710c may be included inside the infrastructure resources 710b and the infrastructure resources 710b may be included inside the organization resources 710a.

Figure 8:
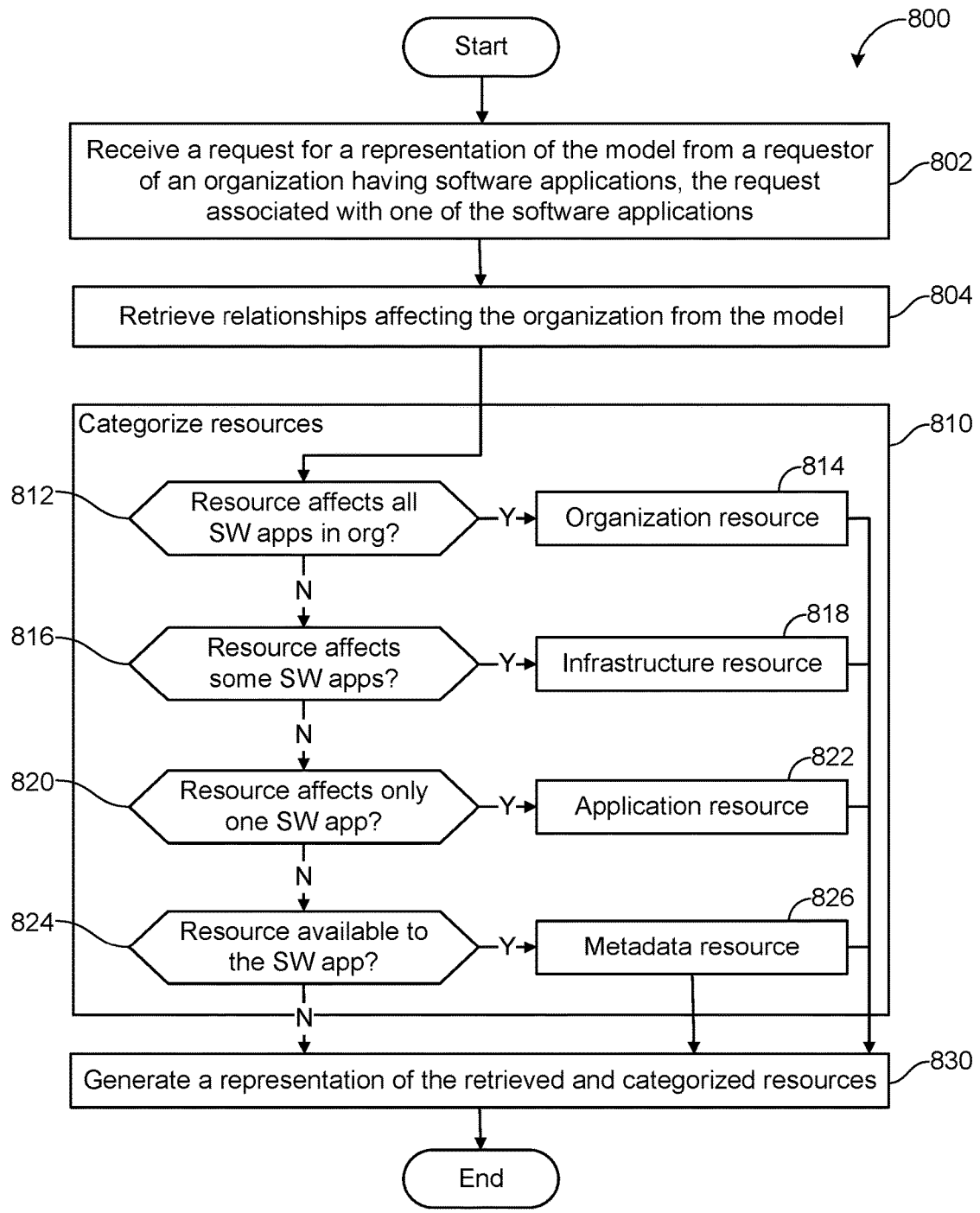
FIG. 8 is an example arrangement of operations for generating a representation of a model of a distributed system.

FIG. 8 depicts a method 800 for generating a representation 700 of the model 222. At 802, the model interface 224 receives a request for a representation of the model 222 from a requestor (e.g., client 130) of an organization. The organization has multiple software applications 732 and the request is associated with one of the software applications (e.g., 732b) of the organization.

At 804, the model interface 224 retrieves relationships effecting the organization from the model 222. The model interface 224 may retrieve the relationships from the model 222 using RDMA through the second NIC 118b, so that the model interface 224 does not have to interact with the second physical processor 112b. At 810, the model interface 224 categorizes the resources 710 in the relationships.

At 812, the model interface 224 determines whether a particular resource 710 affects all the software applications 732 of the organization. If the resource 710 affects all the software applications 732 of the organization then the model interface 224 categorizes the resource as an organization resource 710a.

At 816, the model interface 224 determines whether the resource 710 affects some software applications 732 but not all software applications 732 in the organization. At 818, the model interface 224 categorizes the resource 710 as an infrastructure resource 710b when the resource effects some but not all of the applications. For example, the database 734 that affects the first application 732a and the second application 732b but not the third application 732c.

At 820, the model interface 224 determines whether the resource 710 affects only the software application (e.g., the second application 732b) associated with the request. At 822, the model interface 224 categorizes the resource 710 as an application resource 710c when the resource effects only the software application associated with the request. For example, the virtual machines 742 that affect only the second application 732b and not the first application 732a and the third application 732c.

At 824, the model interface 224 determines whether the resource is available to a software application but is not currently being used by the software application. At 826, the model interface 224 categorizes the resource 710 as a metadata resource 710d, in response to the resource being available to the software application associated with the request for storing metadata information related to other resources 710. For example, the buffer overrun resource 732*b* that is available to the software application to store metadata information related to the package 748. Additionally or alternatively, the model interface 224 may categorize the resource 710 as an overflow resource, in response to the resource being available to the software application associated with the request but the software application not currently using the resource. For example, the buffer overrun resource 752 that is available to the package 748 and the second application 732*b* but the second application 732*b* may not be using the buffer overrun resource 752 at the time of the request. At 830, the model interface 224 generates the representation of the model 222, for example the representation 700 depicted in FIG. 7.

The model interface 224 may include indicia for indicating the different categories of resources 710. In some implementations, the model interface 224 uses different colors to indicate the different categories of resources 710. For example, the model interface 224 may display the organization resources 710*a* in blue, the infrastructure resources 710*b* in green, the application resources 710*c* in black and the metadata resources 710*d* in red. In some examples, the model interface 224 may use different backgrounds, different fonts or different shapes to indicate the different categories of resources. In some implementations, the model interface 224 may categorize the resource 700 into other categories. For example, the model interface 224 may categorize some resources as package resources when only one package uses the resource. In other examples, the model interface 224 may categorize some resources as virtual machine resources when only one virtual machine uses the resource. Other categories are also contemplated.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor and can be implemented in a high-level procedural and/or object-oriented programming language, and/or in assembly/machine language. As used herein, the terms "machine-readable medium" and "computer-readable medium" refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

Implementations of the subject matter and the functional operations described in this specification can be implemented in digital electronic circuitry, or in computer software, firmware, or hardware, including the structures disclosed in this specification and their structural equivalents, or in combinations of one or more of them. Moreover, subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter affecting a machine-readable propagated signal, or a combination of one or more of them. The terms "data processing apparatus", "computing device" and "computing processor" encompass all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as an application, program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

One or more aspects of the disclosure can be implemented in a computing system that includes a backend component, e.g., as a data server, or that includes a middleware component, e.g., an application server, or that includes a frontend component, e.g., a client computer having a graphical user interface or a Web browser through which a user can interact with an implementation of the subject matter described in this specification, or any combination of one or more such backend, middleware, or frontend components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some implementations, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specifics, these should not be construed as limitations on the scope of the disclosure or of what may be claimed, but rather as descriptions of features specific to particular implementations of the disclosure. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multi-tasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

A number of implementations have been described. Nevertheless, it will be understood that various modifications may be made without departing from the spirit and scope of the disclosure. Accordingly, other implementations are within the scope of the following claims.

What is claimed is:

1. A modeling system comprising:
    a non-transitory memory storing a model modeling interactions of resources of a distributed system; and
    a data processing device in communication with the non-transitory memory and executing instructions that cause the data processing device to implement a system monitor, the system monitor monitoring interactions of the resources of the distributed system and building the model by:
        detecting a state change of a first resource of the distributed system;
        identifying an entity causing the state change of the first resource;
        determining whether a second resource of the distributed system also changes state;
        identifying a relationship between the first resource, the second resource, and the entity based on the entity triggering the first resource and the second resource to change state;
        validating the relationship by:
            varying a property of the entity to trigger a state change of the first resource; and
            determining whether the second resource changes state within the threshold time period after the state change of the first resource; and
        updating the model to indicate the relationship between the first resource, the second resource, and the entity.

2. The modeling system of claim 1, wherein the entity comprises a software resource associated with the first and second resources.

3. The modeling system of claim 1, wherein at least one of the first resource, the second resource, or the entity comprises a hardware resource comprises a hardware resource of the distributed system in communication with the data processing device.

4. The modeling system of claim 1, wherein the entity comprises an event affecting a measurable characteristic of the first resource.

5. The modeling system of claim 1, wherein the system monitor:
    receives data from the first resource or the second resource indicating the relationship between the first resource and the second resource; and
    updates the model to indicate the relationship between the first resource and the second resource.

6. The modeling system of claim 1, wherein the system monitor receives data indicating the entity causing the change in state of the first resource.

7. The modeling system of claim 1, wherein the system monitor:

receives a request from a requestor in communication with the data processing device to determine an impact of a first software service on a second software service;
determines a first set of resources of the distributed system associated with the first software service;
determines a second set of resources of the distributed system associated with the second software service;
retrieves relationships between the first set of resources and the second set of resources from the model; and
sends the retrieved relationships to the requestor.

8. The modeling system of claim 1, wherein the system monitor purges the relationship from the model in response to the second resource not changing state within a threshold period of time of the state change of the first resource.

9. The modeling system of claim 1, wherein the entity causing the state change of the first resource comprises at least one of a power surge, a power drop, a change in temperature, a change in processing demand, or a change in memory demand.

10. A distributed system comprising:
a plurality of hardware resources;
a plurality of software resources residing in one or more of the hardware resources;
a non-transitory memory residing in one or more of the hardware resources, the memory storing a model modeling relationships among the hardware resources and the software resources;
a model interface implemented on one or more of the hardware resources, the model interface, when executed on the one or more hardware resources, causing the one or more hardware resources to:
in response to a request for a representation of at least a portion of the model, retrieve relationships affecting the organization from the model, the request originating from a requestor of an organization, the organization having a plurality of software applications, the request associated with one of the software applications;
categorize each resource in the retrieved relationships as one of:
an organization resource, when the resource affects all of the software applications of the organization;
an infrastructure resource, when the resource affects some of the software applications of the organization;
an application resource, when the resource affects only the software application of the organization associated with the request; and
a metadata resource, when the resource is available to the software application for storing metadata related to other resources; and
generate a representation of the retrieved and categorized relationships; and
a system monitor implemented on one or more of the hardware resources, the system monitor, when executed on the one or more hardware resources, causing the one or more hardware resources to build the model by:
detecting a state change of a first resource of the distributed system;
identifying an entity causing the state change of the first resource;
determining whether a second resource of the distributed system also changes state;
identifying a relationship between the first resource, the second resource, and the entity based on the entity triggering the first resource and the second resource to change state;
validating the relationship by:
varying a property of the entity to trigger a state change of the first resource; and
determining whether the second resource changes state within the threshold time period after the state change of the first resource; and
updating the model to indicate the relationship between the first resource, the second resource, and the entity.

11. The distributed system of claim 10, wherein the model interface:
displays a graphical representation of the retrieved and categorized relationships as a directed graph; and
displays indicia indicating the organization resources, the infrastructure resources, the application resources, and the metadata resources.

12. The distributed system of claim 10, wherein at least one of the first resource, the second resource, or the entity comprises a hardware resource comprises a hardware resource.

13. The distributed system of claim 10, wherein the system monitor:
receives data from the first resource or the second resource indicating the relationship between the first resource and the second resource; and
updates the model to indicate the relationship between the first resource and the second resource.

14. The distributed system of claim 10, wherein the system monitor receives data indicating the entity causing the change in state of the first resource.

15. The distributed system of claim 10, wherein the system monitor:
receives a request from a requestor in communication with the data processing device to determine an impact of a first software service on a second software service;
determines a first set of resources of the distributed system associated with the first software service;
determines a second set of resources of the distributed system associated with the second software service;
retrieves relationships between the first set of resources and the second set of resources from the model; and
sends the retrieved relationships to the requestor.

16. The distributed system of claim 10, wherein the system monitor purges the relationship from the model in response to the second resource not changing state within a threshold period of time of the state change of the first resource.

17. The distributed system of claim 10, wherein the first resource comprises a software application and the entity causing the state change of the first resource comprises at least one of a runtime error, a change in processing demand, a change in memory demand, a change in a number of virtual machines, a change in a number of application threads, or a change in a number of users using the software application.

18. A method comprising:
detecting, using a data processing device, a state change of a first resource of a distributed system;
identifying, using the data processing device, an entity causing the state change of the first resource;
determining, using the data processing device, whether a second resource of the distributed system also changes state;
identify, using the data processing device, a relationship between the first resource, the second resource, and the entity based on the entity triggering the first resource and the second resource to change state;

validating, using the data processing device, the relationship by:

varying a property of the entity to trigger the state change of the first resource; and determining whether the second resource changes state within the threshold time period after the state change of the first resource; and updating a model stored in non-transitory memory in communication with the data processing device to indicate a relationship between the first resource, the second resource, and the identified entity.

19. The method of claim 18, wherein identifying the entity comprises identifying a software resource associated with the first resource and the second resource.

20. The method of claim 18, wherein identifying the entity comprises identifying a hardware resource connected to the first resource and the second resource.

21. The method of claim 18, wherein identifying the entity comprises identifying an event causing the change in state of the first resource.

22. The method of claim 18, wherein identifying the entity comprises receiving, via a receiver in communication with the data processing device, data indicating the entity causing the change in state of the first resource.

23. The method of claim 18, further comprising:

receiving data from the first resource or the second resource indicating the relationship between the first resource and the second resource; and updating the model to indicate the relationship between the first resource and the second resource.

24. The method of claim 18, further comprising:

receiving a request to determine an impact of a first software service on a second software service;

determining a first set of resources of the distributed system associated with the first software service;

determining a second set of resources of the distributed system associated with the second software service;

retrieving relationships between the first set of resources and the second set of resources from the model; and sending the retrieved relationships in response to the request.

25. The method of claim 24, further comprising:

receiving a request to return a representation of at least a portion of the model, the request originating from a requestor of an organization, the organization having a plurality of software applications, the request associated with one of the software applications;

retrieving relationships affecting the organization from the model;

categorizing each resource in the retrieved relationships as one of:

an organization resource, when the resource affects all of the software applications of the organization;

an infrastructure resource, when the resource affects some of the software applications of the organization;

an application resource, when the resource affects only the software application associated with the request; and a metadata resource, when the resource is available to the software application to store metadata related to other resources; and generates a representation of the retrieved and categorized relationships.

26. The method of claim 25, further comprising:

displaying a graphical representation of the retrieved and categorized relationships as a directed graph on a display in communication with the data processing device; and displaying indicia indicating the organization resources, the infrastructure resources, the application resources and the metadata resources.

* * * * *